United States Patent [19]

Dietl et al.

[11] Patent Number: 5,164,138

[45] Date of Patent: Nov. 17, 1992

[54] MATERIAL COMPRISING SILICON AND PROCESS FOR ITS MANUFACTURE

[75] Inventors: Josef Dietl, Neuötting; Erhard Sirtl, Marktl; Rolf Bauregger, Burgkirchen, all of Fed. Rep. of Germany; Erich Bildl, Post Franking, Austria; Rudolf Rothlehner, Eggenfelden; Dieter Seifert, Neuötting, both of Fed. Rep. of Germany; Hermann Dicker; Herbert Pichler, both of Ach, Austria

[73] Assignee: Heliotronic Forschungs- und Entwicklungsgesellschaft fur Solarzellen-Grundstoffe mbH, Burghausen, Fed. Rep. of Germany

[21] Appl. No.: 580,349

[22] Filed: Sep. 7, 1990

Related U.S. Application Data

[63] Continuation of Ser. No. 391,644, Aug. 7, 1989, abandoned, which is a continuation of Ser. No. 119,219, Nov. 3, 1987, abandoned, which is a continuation of Ser. No. 814,582, Dec. 27, 1985, abandoned, which is a continuation of Ser. No. 532,467, Sep. 15, 1983, abandoned.

[30] Foreign Application Priority Data

Sep. 30, 1982 [DE] Fed. Rep. of Germany ....... 3236276

[51] Int. Cl.⁵ .............................................. C04B 35/64
[52] U.S. Cl. ....................................... 264/62; 264/60; 264/63; 264/65; 264/86; 264/109; 264/123; 419/10
[58] Field of Search ................ 264/60, 62, 63, 65, 264/86, 123, 109; 419/10; 423/348

[56] References Cited

U.S. PATENT DOCUMENTS

| 1,916,836 | 12/1930 | Haeuber | 264/86 |
| 3,966,885 | 6/1976 | May | 264/65 |
| 4,022,615 | 5/1977 | Wells | 264/86 |
| 4,040,848 | 8/1977 | Greskovich | 264/65 |
| 4,125,592 | 11/1978 | Ezis | 264/65 |
| 4,268,466 | 5/1981 | Ezis | 264/86 |

FOREIGN PATENT DOCUMENTS 779474 7/1957 United Kingdom .
1452578 10/1974 United Kingdom .

*Primary Examiner*—James Derrington
*Attorney, Agent, or Firm*—Collard & Roe

[57] ABSTRACT

A novel material can be obtained by chemical reaction from elemental or alloyed silicon powder, to which fillers are optionally added. The novel material, which can be worked mechanically, can be further refined by means of subsequent heat treatment and/or surface coating, and can in many cases be used instead of polycrystalline or sintered silicon.

30 Claims, No Drawings

MATERIAL COMPRISING SILICON AND PROCESS FOR ITS MANUFACTURE

This is a continuation of copending application Ser. No. 07/391,644 filed on Aug. 7, 1989, (now abandoned) which is a continuation of application Ser. No. 07/119,219 filed on Nov. 3, 1987, now abandoned, which was a continuation of application Ser. No. 06/814,582 filed on Dec. 27, 1985, now abandoned, which was a continuation of application Ser. No. 06/532,467 filed on Sep. 15, 1983, now abandoned.

The present invention relates to a novel material, for the base material of which powder comprising elemental or alloyed silicon is used.

Elemental silicon is a material which is preferred for use in semiconductor technology. For example, the reaction chambers in which semiconductor wafers are subjected to high-temperature processes, such as diffusion, oxidation and epitaxial processes, are, for reasons of purity, usually made of elemental silicon. The polycrystalline silicon-shaped articles suitable for this purpose are, as a rule, obtained by the deposition of silicon from the gas phase onto heated and appropriately shaped supports, as described, e.g., in DE-OS 26 18 273. A further possibility comprises sawing such shaped articles out of blocks of silicon, using diamond saws. The high cost of gas-phase deposition and the fact that silicon is extremely difficult to work because of its brittleness and its sensitivity to fracture have, however, hitherto prevented its use as a material from spreading to application areas other than such specialized ones.

The object of the invention is, therefore, to make available a material which, based on a silicon base material that is cheaper, more readily obtained and easier to work than conventional polycrystalline silicon, permits the manufacture of shaped articles of a very wide variety of types and shapes, having a very wide variety of possible uses.

This object is achieved according to the present invention by means of a novel material which can be obtained by a process which is characterized in that, in order to initiate self-sustaining reaction bonding, the powder comprising elemental or alloyed silicon is moistened with a silicon-etching agent. Before the reaction bonding is complete, a first shaping step is carried out, and during and/or after the reaction bonding, remaining liquid portions of the agent are removed by the action of heat.

In the material of the invention, the powder comprising elemental or alloyed silicon used is in the form of a solid structure in which filler particles that have possibly been added are embedded. In contrast to the loose powder used, scanning electron microscope investigations of reaction-bonded powder show that, in the contact zones, the individual powder particles have grown together by means of a second phase occurring during the reaction bonding. This, as well as the oxygen content, which can be determined by analysis and is greater than in the case of the starting powder, being typically in the range of approximately from 5 to 20% by weight based on the silicon used, and the significant decrease in electrical conductivity compared with elemental silicon, leads to the supposition that the reaction bonding is effected by means of the linking of the individual powder particles, with the participation of oxygen, in the surface region.

In order to initiate the reaction bonding, a process has proved advantageous in which the selected agent is added to the selected silicon powder in such a manner that a uniformly soaked substance is obtained. While being shaped, this substance can, e.g., be spread or cast until, after some time, the reaction bonding begins and the substance, as a rule, solidifies with the evolution of heat. Another possible method of shaping comprises introducing silicon powder that is still dry or is only moistened with, e.g., water, into a mold and only then adding the agent selected for the reaction bonding. The heat that is generated during the reaction is usually sufficient to evaporate off any moisture present and to dry the reaction product. The drying process can additionally be promoted by the action of heat from an external source, only temperatures below the boiling point of water usually being required. In addition, it is possible for the heat treatment to be carried out as a final step, although this is not imperative. In this manner, shaped articles based on the material of the invention are obtained, either in the form of a crude product which is to be processed further, or as a finished product.

Powder comprising elemental or alloyed silicon is used as the base material for the manufacture of the material of the invention. The reaction bonding can be initiated even in the case of powders such as, e.g., ferrosilicon of the formula FeSi, which have a silicon content of less than 50% by weight. It is equally possible, however, for even very pure silicon of semiconductor quality to be bonded by the process according to the invention. It is thus possible to select silicon powder of a degree of purity suitable in each case, depending on the intended use of the material to be produced. For example, the very purest silicon powder will be used as the starting material when, for example, reaction chambers for high-temperature processes, such as, e.g., doping or epitaxial processes in semiconductor technology, are to be made from the material manufactured therefrom. On the other hand, there already comes into consideration, e.g., as a base material for heat-insulating boards, a material based on considerably less pure silicon powder. The material of the invention can thus be obtained, for example, from powders comprising very pure silicon containing well over 99.99% by weight of silicon, or from industrial silicon containing up to 4% by weight of impurities, and also from silicon-containing alloys that are customary in metallurgy and are commercially available, for example in the form of various types of ferrosilicon containing approximately from 45–48% by weight, from 75–77% by weight, or from 92–94% by weight, of silicon, in the form of calcium-silicon containing approximately 60% by weight of silicon, or in the form of a silicon-aluminum alloy containing typically from 5–15% by weight of silicon and referred to as "Silumin". Of course, elemental or alloyed silicon powders other than those mentioned here as examples are possible starting materials. For the sake of simplicity, the term "silicon powder" is used below for the whole range of such suitable starting materials.

The process for the manufacture of the material of the invention can be carried out using silicon powder, the mean particle size of which can be varied within a wide range. The term "mean particle size" is to be understood in this context to mean that 50% by weight of the powder particles are smaller than or the same as the value indicated and that 50% are larger than or the same as this value. The presence of considerably smaller and considerably larger particles is therefore not excluded. For example, even very fine silicon powder having a mean particle size of approximately 0.1 μm, but also coarse silicon powder having a mean particle size of approximately 500 μm can be bonded. In principle, it is also possible to use types of powder having mean particle sizes outside these limiting ranges; however, in the case of finer silicon powders, the reaction bonding may be accompanied by foaming and the formation of a product containing cavities, while coarser powders often produce a product which tends to crumble and is not very mechanically stable. In general, by selecting silicon powder having an appropriate mean particle size and appropriate particle-size distribution, it is possible to vary properties such as density, porosity, thermal conductivity, mechanical stability and the like, and to match them to particular requirements. For example, it is preferable to use silicon powder having coarse particles and a small proportion of fine particles as the base material for porous filter plates, but, on the other hand, to use silicon powder having fine particles and a high bulk density for dense and compact material, for example as the starting material for gas-impermeable shaped articles.

Silicon powder of a suitable mean particle size, especially in the preferred range of from 1 to 100 μm, can be obtained specifically, for example by grinding crude silicon, which is obtainable in coarse pieces, in ball or vibration grinding mills. Suitable starting material is also obtained on a large scale during the comminution of the lump crude silicon used in the production of silane in a fluidization process, in the form of so-called "undersize", that is to say in the form of a powder fraction which is too fine for use in a fluidized bed and has hitherto had to be remelted in a complicated manner in order to be used again. Very pure silicon powder of a suitable mean particle size can be obtained, for example, in rebound crushers or air-jet mills, where the risk of impurities is kept especially small.

A further possible means of influencing the quality and the desired properties of the novel material comprises adding fillers to the silicon powder, it being possible for the type, particle size and amount of the suitable fillers to be varied within wide limits. Suitable fillers are, e.g., oxides, such as those of silicon, aluminum, titanium or other elements, for example quartz, corundum, rutile, anatase, zirconium oxide or the like, as well as, e.g., mixed oxides, such as, e.g., ferrites, and powders of metals, such as, e.g., iron, copper, zinc, tin or aluminum, or alloys, such as, for example, brass. In addition, it is also possible for compounds such as, e.g., gypsum, calcium carbonate or barium sulphate, mechanically resistant materials, such as titanium carbide, tungsten carbide or silicon carbide, and also borides, and nitrides, such as boron nitride or silicon nitride, and graphite, and even sands, dusts or ground slags, to be added.

The range of mean particle sizes suitable for the fillers added in each case corresponds in principle to the range that is also suitable for the initially introduced silicon powder; it is, however, not necessary for the same mean particle size to be selected in each case. For example, silicon powder having a mean particle size of approximately 3 μm can easily be bonded with quartz powder having a mean particle size of approximately 100 μm. Conversely, however, it is also entirely possible, for example, for silicon powder having a mean particle size of 150 μm to be bonded in the presence of rutile powder having a mean particle size of 10 μm.

The ratio of the amount of added filler to the amount of initially introduced silicon powder can also be varied within wide limits. The reaction is generally trouble-free even when 50% by weight of filler or more, based on the amount of silicon used, is added. This provides an opportunity for the amount and type of filler to be added to be selected according to the planned use of the material. For example, by adding approximately 50% by weight of quartz powder or corundum powder, based on the amount of silicon used, it is possible further to increase the product's already considerable resistance to high temperatures, making it suitable as the base material for, e.g., furnace or casting-die linings, heat-insulating boards, crucibles or the like. On the other hand, it is possible, for example, for the electrical conductivity and heat conductivity of the product to be influenced in a specific manner by the addition of metal powders. In view of the enormous number of combinations of type, amount and particle size of the filler and of the initially introduced silicon powder, there are numerous other possible variations available to a person skilled in the art, which do not, however, depart from the basic idea of the invention. The examples mentioned here are intended merely to illustrate, and not to limit, the idea of the invention.

As in the case of the properties of the silicon powder used and the optionally added fillers, there is also a wide range of possible variations in the case of the agent added to initiate the reaction bonding. In principle, all agents which are capable of etching silicon can be used. For example, alkaline aqueous systems, but also acidic aqueous systems in the presence of oxidizing agents, and even, if only to a small extent, pure water, have this property. In addition, a few organic systems which are capable of etching silicon, as well as, for example, alcoholic alkaline systems, are also known. Suitable agents are, therefore, for example, water, aqueous solutions of hydroxides of alkali metals and/or alkaline earth metals, especially sodium hydroxide and potassium hydroxide, other aqueous salt solutions having an alkaline reaction, such as, for example, carbonates of alkali metals, especially sodium carbonate and potassium carbonate, but also sodium acetate or suitable sodium phosphates. If a product which is as pure as possible is desired, it is possible to advantageously use an aqueous ammonia solution, as this agent can be driven off again, virtually without leaving a residue, in a heat treatment following the reaction bonding. In addition to aqueous alkaline systems, alcoholic solutions, e.g., sodium hydroxide in methanol or ethanol, are also suitable. The reaction bonding can also be initiated by means of acid treatment, especially by successive treatments with nitric acid and hydrofluoric acid or a hydrofluoric acid/hydrochloric acid mixture. In this context there should also be mentioned the acid etching mixtures customary in semiconductor technology, such as, for example, the polishing etching liquid CP4 based on nitric acid/hydrofluoric acid/acetic acid (Holmes, P. J., *Proc. Inst. Elekt. Engrs.*, B 106 (Suppl. 17), 861 (1959)). Such acid treatments require, however, relatively high concentrations and can lead, especially in connection with silicides, to the undesired formation of the silanes that tend to ignite spontaneously. The use of organically based etching mixtures, such as, e.g., hydrazine/pyrocatechol mixtures, which is also possible in principle, is scarcely considered for wider applications, if only for reasons of cost. As a rule, therefore, alkaline aqueous solutions, especially sodium hydroxide solutions, are preferred. A 2 to 5% by weight sodium hydroxide solution, which is sufficient in most cases to initiate the reaction bonding, has proved especially suitable. In general, it can be determined by means of a few preliminary tests whether concentrated, dilute or very dilute solutions, for example solutions of the preferred sodium hydroxide, are sufficient for bonding the selected silicon powder and, optionally, the added filler. If only for reasons of economy, the aim is, of course, to use agents of the lowest possible concentration.

The process for manufacturing the material according to the invention is advantageously carried out by mixing together the selected components, i.e., the silicon powder, optionally together with the filler, and the agent which initiates the reaction bonding. It is usually enough to add the agent in a quantity which is sufficient to moisten the silicon powder uniformly. For this purpose the agent can be added gradually to the powder, while stirring, until a mixture of a pulpy consistency, which is easy to shape, is obtained. Stirring can be carried out manually or by machine. Another possible means of mixing comprises simply allowing the agent to run through the dry or moistened silicon powder, which is optionally in a mold, forcing it through by means of suction, using a vacuum, or forcing it through under pressure, for example by means of compressed air or inert gas.

A first shaping step can be carried out by first introducing the silicon powder, while still dry, into a mold and then adding the agent which initiates the reaction bonding. During this process, however, attention should be paid to the risk that, under certain circumstances, the silicon powder may be unevenly moistened by the agent and will, correspondingly, bond unevenly. A further possibility is first to moisten the silicon powder with a liquid which is incapable of initiating the reaction bonding, or is capable of initiating it only slowly, such as, for example, alcohol or pure water, introducing this mixture into the desired mold and then adding the actual agent. In accordance with an especially advantageous embodiment of the process of the invention, it is, however, desirable to moisten the silicon powder outside the mold with an agent whose concentration is so selected that the reaction does not start immediately, but only after a certain amount of time, and following which it sustains itself. During this time there is a further opportunity to shape the substance comprising silicon powder and agent. This can be done, e.g., by coating a suitable substrate, for example, glass, metal or plastic plates, filter cloths or filter paper, with the substance to form a sheet-like structure. Another possibility comprises introducing, e.g., pouring, e.g., by means of centrifugal casting or injection molding, ramming or pressing, the substance into molds which are advantageously already in the shape of the desired product, in order to obtain, e.g., hollow bodies, such as pipes or hollow crucibles, but also solid bodies, such as blocks, thin or thick rods, plates, or other shaped articles of a very wide variety of types.

It is important to make it possible for the gases evolving during the reaction bonding, especially steam and, to a lesser extent, hydrogen, to escape; for this purpose it is recommended that, for example, porous hollow molds be used or provided with slots or other openings through which the gases, but not the substance which has not yet bonded, can escape. In principle, the use of dense molds with gas discharge means, for example hollow molds open at one side or provided with a gas-permeable lid, is not to be excluded, since, because of the porosity of the material of the invention, it is in general possible for the gases evolving during bonding to escape from such molds also. If a material having a very porous consistency is desired, the gas evolution can be used during the bonding process to swell the material. For this purpose, it is advantageous to ensure before bonding takes place that there is a high proportion of residual moisture. A particular advantage in shaping the substance to be bonded is that, for example, large hollow molds can also be filled in several stages, it being possible for the next part of the batch to be introduced in each case after the end of the reaction bonding of the preceding part of the batch. The individual batches bond together easily, so that even complicated shaped articles can be manufactured by bonding various individual elements.

If an especially compact, dense consistency of the material of the invention is required, it has proved advantageous to carry out the first shaping step under the influence of pressure. Generally suitable for that purpose are devices, where shapable masses can be brought into a certain shape by pressure or where pre-shaped masses can be densified by pressure. Such devices are used, for example, in the ceramic industry for pressing plates, brick, crucibles, and other shaped bodies, and can, respectively, also be used for pressing the material of the invention during the bonding process. Therefore, as a rule, a short action of pressure, in most cases of a few seconds preferably in the starting phase of the reaction bonding, is sufficient to obtain a dense material with improved mechanical stability, e.g., compression strength, compared to material which was not pressed. The pressure to be applied can generally be varied in the range which is suitable for the actual press, increased pressure resulting in an increased density of the product. Good results are obtained in a pressure range up to 300 bar. Furthermore, it has proved advantageous, that the shaped bodies can be shaped in stages by several subsequent pressing steps, which makes it possible to obtain even products with complicated forms.

In an advantageous embodiment of the process for the manufacture of the material of the invention, the various reaction parameters, such as the type and article size of the silicon powder and, optionally, of the filler, and the type and concentration of the agent that initiates the reaction bonding which is to be added, are matched to one another in such a manner that the reaction does not begin immediately, but only after a period of time which permits the required shaping process to be completed without interference. The onset of the reaction bonding can be recognized by an increase in the temperature of the mixture of silicon powder and agent. This temperature increase is frequently accompanied by the evolution of gas, which, for example in the case of aqueous agents, is a result mainly of evaporating water, in addition to the formation of hydrogen.

An especially advantageous means—which is preferred in the context of the manufacturing process—for controlling the period of time between the mixing of the components and the onset of the reaction bonding, the so-called "pot time", comprises exposing the substance to an elevated temperature once the shaping process is complete. For this purpose, the range between a temperature slightly higher than room temperature and the boiling point of the agent used is usually sufficient; the use of higher temperatures, which is possible in principle and is not excluded, is not generally necessary. In the case of aqueous agents, a temperature range of from 70° to 90° C. has proved especially suitable. Elevated temperatures can be applied, for example, by passing hot air, by means of a fan, over or through the substance, which has been preshaped, for example to form plates. Furthermore, the preshaped substance, optionally together with the mold, can be exposed, in a suitable furnace, e.g., a drying oven, a tempering oven or a hot-air oven, to an elevated temperature; the use of microwaves is also conceivable. In addition, there is the possibility of providing heatable molds, the walls of which can either have a heating agent, such as, for example, hot water or steam, passed through them, or can be heated by means of electricity or by gas burners. The elevated temperature enables the reaction bonding to start, as a rule, within a few minutes, and for mixtures which do not bond, or bond only sluggishly, at room temperature to be caused to react. Another advantage of the elevated temperature is that the bonding mixture can be dried more quickly and reliably than at room temperature.

As the end product of the reaction bonding and, optionally, of the drying process, the novel material is then available in the form of a mechanically stable structure of the powder particles used and can then either be used as planned or be finished by means of further, suitable after-treatment.

Properties such as, for example, mechanical stability, hardness, resistance to fracture, high-temperature resistance and the like can be influenced advantageously by heat treatment of the material. Even, for example, a short, 5 to 15 minute, heat treatment at approximately 200° C. as a rule brings about an appreciable degree of hardening. The hardening becomes even more pronounced if the material is exposed to a temperature in the red-heat range, that is to say, approximately from 600°-700° C. Although in the case of such a high-temperature resistant material composition, it is also possible in principle to increase the temperature to above the melting point of silicon, especially in the case of a short heat treatment, if only for economical reasons, however, as low a temperature as possible is aimed for. Good results can be obtained, for example, in the temperature range of from 600°-1200° C.

Of course, the choice of filler is not without influence on the temperature range possible for the heat treatment. For example, a material manufactured from silicon powder and quartz powder in a ratio by weight of 1:1 permits the use of tempering processes well above the melting point of silicon.

Because of the temperature-shock resistance of the material, the heat treatment can be carried out by exposing the material directly to the selected temperature. The subsequent cooling does not require any special precautions either. In this connection, it is especially advantageous that the heat treatment does not require an inert gas atmosphere, which would, in principle, be possible, but on the contrary can be carried out especially successfully in air. Thus, in addition to furnaces in current use, such as, for example, muffle furnaces, pot furnaces, or chamber ovens, e.g., types of furnaces customary in the ceramics industry can also be used; suitable are, e.g., furnaces of open construction, through which the object to be treated is passed with the access of air. As a rule, the heat treatment takes only approximately 5 to 15 minutes, although, in principle, shorter or longer periods should not be excluded.

In principle, such a heat treatment can follow directly the mixing of the silicon powder with the agent. This provides the possibility, especially in the case of small shaped articles, of carrying out the reaction bonding and the heat treatment in one process step.

An advantage of the material of the invention is the fact that it is easily worked mechanically, which makes it possible in a simple manner, further to work articles of the material preshaped, e.g., by having been poured into a mold, or to make shaped articles out of blanks, such as, for example, blocks or rods. Such shaping can be carried out either after the reaction bonding or after an optional heat treatment. The possibilities for working the material of the invention are largely comparable to those for graphite or some ceramics materials. It can therefore, for example, be sawn, ground, turned or drilled, and thus offers a plurality of shaping possibilities.

A further, very important possible means of after-treating the material of the invention is to finish its (inner and outer) surface by producing surface layers of a very varied type. For example, by means of a short high-temperature treatment, for example by means of radiation heating or flame heating, the surface of the material can be caused to melt. As a result, a smooth, dense surface layer forms, the thickness of which, depending on the duration of the high-temperature treatment, can cover a range of from a few micrometers to several millimeters. Such a surface treatment is, as a rule, sufficient to make the material impermeable to gas and thus capable of being used in gas reactors, supply pipes, gas pipes, crucibles and the like.

In addition, however, there is also the possibility of applying additional surface layers to shaped articles made from the material. This can be effected especially easily by spraying, by mechanical application or by immersion in an appropriate melt of the selected coating material. For example, it is possible to provide a shaped article, reaction bonded from very pure silicon powder with a coating of very pure silicon by immersing it in a very pure, silicon melt at approximately from 1450°-1500° C. In principle, however, even shaped articles made of a less pure base material can be rendered suitable for processes requiring extreme purity by being immersed in very pure silicon melts.

Layers of silicon or other suitable materials can also be applied to the material of the invention by coating, from the gas phase, either by means of the deposition of the coating material from the gas phase or by reaction of the material with the gas phase to form a new surface layer. Examples of coating by deposition are the decomposition of silicon halides, boron halides or hydrocarbons on heated substrates of the novel material, by means of which these substrates can be covered by layers of silicon, boron or carbon. Such coating processes, which are, of course, not limited to the examples mentioned here, are known and customary in coating technology for other substrates also. This also applies to the possibility of applying coatings, by means of reaction with a gas phase, to substrates made of the material of the invention. Of the large number of possible applications, there may be mentioned here, e.g., nitriding by causing ammonia or nitrogen to flow over or through the porous material of the invention at high temperatures, oxidation with, for example, moist oxygen, or carbide formation using hydrocarbons. These processes are known for the surface treatment of monocrystalline or polycrystalline elemental silicon and can be applied analogously to the bonded silicon powder of the invention.

The properties and the form of the material according to the invention can therefore be varied within wide limits by means of the choice of starting materials, the conditions of the reaction bonding and by heat treatment and/ or coating, and because of its ability to be worked easily. The possible applications of the material are correspondingly numerous; a few of these are mentioned below, merely by way of example. For example, the material of the invention, provided with a coating of very pure silicon, can in many cases be used instead of polycrystalline silicon, for example as a support in silicon deposition by means of the thermal decomposition of silanes, or for reaction chambers in the case of high-temperature processes in the semiconductor industry. As a material which is extremely fireproof and is resistant to chemicals, the material of the invention is an excellent heat-insulating material and can be used, for example, for lining furnaces or crucibles, or as a casting mold. The reaction bonding can easily be reversed by, for example, renewed saturation with the agent prior to a heat treatment. The conversion of enclosed casting cores made of the material of the invention into suspended powder or the manufacture of thin layers or thin-walled articles by coating the material of the invention and then completely or partially "dissolving" the material acting as the substrate is thus possible directly.

In accordance with the last-mentioned process it is possible to obtain, for example, silicon sheets for solar cells by providing plates or strips of the material of the invention, for example on one side, with a cohesive silicon layer and then converting the said plates or strips, which have been used as substrates, back into powder form.

Because of the material's high mechanical stability it is even conceivable to use it as a building material, whereas its porosity makes possible its use as a filter material. A further field of application is compacting, especially pelleting, for example very fine silicon dusts. An interesting application arises from the fact that silicon articles can be bonded to one another, as it were "glued" to one another, by means of a reaction-bonding intermediate layer. For this purpose, the contact surfaces of the articles to be bonded are coated with a mixture of advantageously fine silicon powder and agent which has not yet finished reacting and are then joined together. A firm bond between the individual components is then produced by the reaction bonding, especially when assisted by an increase in temperature. In this manner, especially even relatively large shaped articles which are otherwise difficult to obtain can be constructed from appropriately shaped silicon components. Not least, reference is made here to the possibility of using the material as a substrate in various coating and deposition processes.

The material of the invention thus makes it possible to manufacture shaped articles of very different kinds, for a very wide variety of intended uses, using silicon powder as the base material. It is especially advantageous in this connection that, in contrast to, for example, the sintering processes, which require high temperatures, the bonding of the powder by chemical means can be carried out at significantly lower temperatures.

In the following, the invention will be more fully described in a few examples. It should, however, be understood that these are given by way of illustration and not of limitation.

EXAMPLE 1

Various silicon powders of the compositions and mean particle sizes given below, which were optionally mixed with a filler, were introduced into a cylindrical hollow mold having a depth of 2.5 cm and a diameter of 2 cm, which was connected to a vacuum unit. The agent selected in each case was then forced through by suction until the powder was uniformly moistened. The resulting shaped articles were exposed in a drying oven or muffle furnace (Test 6) to an elevated temperature, in order to accelerate the reaction. After a few minutes, the bonding reaction was so far advanced that a rigid solid cylinder of the material of the invention could be removed from the drying oven. The numerical data for the individual batches are summarized in Table 1.

TABLE 1

| Test | Si powder | Si content (% by weight) | Mean particle size ($\mu$m) | Filler | Mean particle size ($\mu$m) | Weight ratio Si powder/filler | Temperature | Agent |
|---|---|---|---|---|---|---|---|---|
| 1 | Very pure Si | 99.9999 | 5 | — | — | — | 80° C. | 5% by weight $NH_3/H_2O$ |
| 2 | Crude Si | 98 | 20 | $SiO_2$ | 100 | 1:1 | 85° C. | 2.5% by weight $NaOH/H_2O$ |
| 3 | FeSi | 45 | 32 | — | — | — | 80° C. | 5% by weight $NaOH/H_2O$ |
| 4 | AlSi | 25 | 25 | — | — | — | 80° C. | 1% by weight $NaOH/H_2O$ |
| 5 | Crude Si | 96 | 70 | Cu | 5 | 1:1 | 80° C. | 3% by weight $KOH/H_2O$ |
| 6 | Very pure Si | 99.9999 | 15 | — | — | — | 800° C. | 6.5% by weight $HNO_3$ 8% by weight HCl 4% by weight HF $H_2O$ |
| 7 | Pure Si | 99.99 | 40 | — | — | — | 80° C. | 10 parts by weight 15% by weight hydrazine/$H_2O$ 1 part by weight pyrocatechol |
| 8 | Pure Si | 99.99 | 10 | — | — | — | 60° C. | 12% by weight NaOH/ethanol |

EXAMPLE 2

A cylinder manufactured in accordance with Example 1, Test 1, was heated for 20 hours in a hydrogen/nitrogen atmosphere (H$_2$:N$_2$-20:80% volume) at 1350° C. The resulting cylinder was completely nitrided.

EXAMPLE 3

Acid-leached crude silicon (Si content 99.99% by weight) having a mean particle size of 25 μm, was introduced into a gas-permeable square plate-mold having sides 10 cm in length and having a depth of 1 cm, soaked uniformly with 2.5% by weight aqueous sodium hydroxide solution and caused to bond for 10 minutes at 80° C. The resulting plate was cut in half using a metal saw. One half was then heat treated in air for 10 minutes at 800° C. The compression strength and oxygen content of both halves of the plate were then determined. The values are shown in Table 2.

TABLE 2

| Sample | Temperature (°C.) | Compression strength (kg/cm$^2$) | O$_2$ content (% by weight) |
|---|---|---|---|
| 1 | 80 | 60 | 7.5 |
| 2 | 800 | 150 | 10.3 |

EXAMPLE 4

5% by weight aqueous NH$_3$ solution was added gradually, with stirring, to 500 g of a powder comprising very pure silicon and having a mean particle size of 3.5 μm, until a paste-like, uniformly soaked substance had formed. This substance was introduced into a gas-permeable hollow mold in the shape of two pipes, one inside the other, having a distance between the walls of 1 cm, the external diameter of the inner pipe being 5 cm and the whole being 20 cm in height. Once filled, the mold was placed in a drying oven at 80° C. When the hollow mold had been removed after 10 minutes, a porous, stable pipe comprising reaction-bonded silicon powder was obtained. This pipe was melted on the inside to a layer depth of approximately 200 μm by moving the flame of a hydrogen burner past it. The resulting pipe, the inner wall of which was fused on the surface, was impermeable to gas.

EXAMPLE 5

The end faces in each case of two pipes made of polycrystalline silicon (length 500 mm, diameter 100 mm, wall thickness 6mm) were rendered free of grease. Then a stirred paste of very pure silicon powder having a mean particle size of 3.5 μm and 5% by weight aqueous ammonia was applied thinly. The end faces of the pipes were then pressed together and left for 10 minutes at 80° C. in a drying oven. The two pipes were then firmly bonded to one another.

EXAMPLE 6

One of the square surfaces of a plate manufactured in accordance with Example 3 and comprising 99.99% by weight of silicon (dimensions 10×10×1 cm$^3$) was placed on a melt of very pure silicon (99.9999% by weight silicon content) kept at 1450° C. and lifted off again after 10 seconds. The plate was coated on one side with a dense layer, approximately 200 μm thick, of very pure silicon. The reaction-bonded plate was then immersed in 15% by weight of aqueous sodium hydroxide solution and converted to powder form, so that an approximately 200 μm thick plate of very pure silicon was obtained.

EXAMPLE 7

5 kg of crude silicon having a particle size of 50 μm were mixed with 5 kg of sand having a particle size of 250 μm. 2% by weight aqueous sodium hydroxide solution was added gradually during the mixing process until a uniformly soaked substance was obtained. This substance was introduced into four molds having the dimensions 25×12.5×6.5 cm$^3$ and lined with a filter cloth made of polypropylene. The filled molds then passed through a continuous furnace, at 80° C., for 10 minutes. The resulting tiles were removed from the molds and passed through a continuous furnace, at 800° C., in order to increase the already considerable strength. The tiles obtained after 10 minutes in the furnace had the compression strength of customary tile material.

EXAMPLE 8

17.5 kg of crude silicon (98% by weight silicon content) were wet-ground, with the addition of water, in a vibration grinding mill having steel grinding members, until a mean particle size of 20 μm was reached. The resulting substance was freed of water by means of decanting until the water content was approximately 30% by weight ("residual moisture"), and introduced into a gas-impermeable sheet-steel mold having the dimensions 25×25×50 cm$^3$ and closed by a gas-permeable lid, so that this mold was approximately half full. A short while after the mold was placed in a furnace which had been heated to 80° C., the reaction began; during the course of the reaction the substance foamed and filled the entire mold. After 15 minutes, a solid block having the above dimensions could be removed.

EXAMPLE 9

Acid-purified crude silicon (approx. 150 g, Si-content 99.99% by weight) having a mean particle size of 25 μm, was mixed with 3.5% by weight aqueous sodium hydroxide solution, until the moisture content was about 20% by weight. This mass was filled into a pressing-mold (dimensions 10×10×1 cm$^3$), pressed at a pressure of 200 bar for 3 seconds, then for 10 minutes kept at a temperature of 80° C. and finally heated to 800° C. for 30 minutes. A comparative sample was treated in a similar way, but without application of pressure.

The density of the pressed sample was 1.6 g/cm$^3$, of the sample without pressure 1.0 g/cm$^3$.

The compression strength of the pressed sample was 450 kg/cm$^2$, of the sample without pressure 160 kg/cm$^2$.

While only a few examples of the present invention have been described, it is obvious that many changes and modifications may be made thereunto, without departing from the spirit and scope of the invention.

What is claimed is:

1. A process for the manufacture of a shaped article made of particles of a material based on silicon by bonding said particles to one another by reaction with a liquid agent comprising the steps of:

providing a mixture including a powder comprising a member selected from the group consisting of elemental silicon, alloyed silicon, and a combination thereof, said mixture further including a silicon etching liquid agent, the concentration of which is selected so that the bonding reaction does not start immediately;

wherein an aqueous solution containing an alkaline etching agent is used as the silicon etching agent;

and wherein said aqueous solution contains 1% to 3% by weight alkaline etching agent;

mixing together said powder and said silicon etching liquid agent of said mixture in order to produce a uniformly moistened powder, said uniformly moistened powder being moistened outside a mold;

performing a first shaping step on said uniformly moistened powder before the bonding reaction has started, so as to produce a moistened molded powder;

exposing the moistened molded powder to an elevated temperature of from 60° C. up to the boiling point of said agent in order to initiate the reaction bonding, said exposing step having a duration of 5 to 15 minutes; and continuing the temperature treatment until the remaining portions of the agent are removed to thereby form a shaped article.

2. The process of claim 1, wherein sodium hydroxide solution is used as the silicon-etching agent.

3. The process of claim 1, wherein aqueous ammonia solution is used as the silicon-etching agent.

4. The process of claim 1, additionally including the step of adding filler to the silicon powder.

5. The process of claim 4, wherein quartz is added to the silicon powder as said filler.

6. The process of claim 1, additionally including the step of subjecting already bonded material to an additional heat treatment at from 600° to 1200° C.

7. The process of claim 1, additionally including the step of subsequently providing the already bonded material with a surface coating.

8. The process of claim 1, wherein said temperature is in a range of from 70° to 90° C. during said exposing step.

9. The process of claim 1, wherein in said mixing step, said powder and said liquid etching agent are added together while stirring.

10. The process of claim 1, wherein said mixing step is carried out by allowing said liquid etching agent to run through said silicon powder.

11. The process of claim 1, wherein said mixing step is carried out under pressure.

12. The process of claim 1, wherein said mixing step is carried out with use of a vacuum.

13. The process of claim 1, wherein said continuing heat treatment step is performed during the reaction bonding.

14. The process of claim 1, wherein said continuing heat treatment step is performed after the reaction bonding is complete.

15. The process of claim 1, wherein said performing said first shaping step is carried out under the influence of pressure.

16. A process for the manufacture of a shaped article made of particles of a material based on silicon by bonding said particles to one another by reaction with a liquid agent comprising the steps of:

providing initial substances including a powder comprising a member selected from the group consisting of elemental silicon, alloyed silicon, and a combination thereof, said initial substances further including a silicon etching agent, the concentration of which is selected so that the bonding reaction does not start immediately;

wherein an aqueous solution containing an alkaline etching agent is used as the silicon etching agent; and wherein said aqueous solution contains 1% to 3% by weight alkaline etching agent;

forming a uniformly moistened powder by mixing together the initial substances in order to produce a uniformly moistened powder, said uniformly moistened powder being moistened outside a mold;

performing a first shaping step on said uniformly moistened powder before the bonding reaction has started so as to produce a moistened molded powder;

exposing the moistened molded powder to an elevated temperature of from 60° C. up to the boiling point of said agent in order to initiate the reaction bonding, said exposing step having a duration of 5 to 15 minutes; and continuing the temperature treatment until the remaining portions of the agents are removed to thereby form a shaped article.

17. The process of claim 16, wherein said continuing heat treatment step is performed during the reaction bonding.

18. The process of claim 16, wherein said continuing heat treatment step is performed after the reaction bonding is complete.

19. The process of claim 16, wherein sodium hydroxide solution is used as the silicon-etching agent.

20. The process of claim 16, wherein aqueous ammonia solution is used as the silicon-etching agent.

21. The process of claim 16, additionally including the step of adding filler to the silicon powder.

22. The process of claim 21, wherein quartz is added to the silicon powder as said filler.

23. The process of claim 16, wherein said performing said first shaping step is carried out under the influence of pressure.

24. The process of claim 16, additionally including the step of subjecting already bonded material to an additional heat treatment at from 600° to 1200° C.

25. The process of claim 16, additionally including the step of subsequently providing the already bonded material with a surface coating.

26. The process of claim 16, wherein said temperature is in a range of from 70° to 90° during said exposing step.

27. The process of claim 16, wherein in said forming step, said initial substances are added together while stirring.

28. The process of claim 16, wherein said forming step is carried out by allowing said liquid etching agent to run through said silicon powder.

29. The process of claim 16, wherein said forming step is carried out under pressure.

30. The process of claim 16, wherein said forming step is carried out with use of a vacuum.

* * * * *